(12) United States Patent
Natzle

(10) Patent No.: US 7,851,299 B2
(45) Date of Patent: Dec. 14, 2010

(54) SUBGROUNDRULE SPACE FOR IMPROVED METAL HIGH-K DEVICE

(75) Inventor: Wesley C. Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 12/061,113

(22) Filed: Apr. 2, 2008

(65) Prior Publication Data

US 2009/0250782 A1  Oct. 8, 2009

(51) Int. Cl.
*H01L 21/8238* (2006.01)

(52) U.S. Cl. .................. 438/230; 438/294; 438/591; 257/348; 257/310

(58) Field of Classification Search .............. 438/294, 438/591; 257/508
See application file for complete search history.

(56) References Cited

U.S. PATENT DOCUMENTS 6,004,878 A * 12/1999 Thomas et al. .............. 438/655
6,710,398 B2 * 3/2004 Wu .............................. 257/316
2009/0243031 A1 * 10/2009 Natzle et al. ................ 257/508

* cited by examiner

*Primary Examiner*—Jarrett J Stark
*Assistant Examiner*—Nicholas Tobergte
(74) *Attorney, Agent, or Firm*—Scully, Scott, Murphy & Presser, P.C.; H. Daniel Schnurmann

(57) ABSTRACT

The present invention provides a semiconducting device including a substrate including at least one semiconducting region and isolation regions; a gate structure atop the substrate having a gate dielectric layer positioned on the semiconducting region and a metal layer atop the gate dielectric layer, the gate structure having a width equal to or greater than the width of the at least one semiconducting region; and a contact structure including a base having a first width equal to the width of the gate structure and an upper surface having a second width, wherein the first width is greater than the second width. In one embodiment, the contact structure includes a polysilicon conductor and dielectric spacers, wherein each spacer of the dielectric spacer abuts a sidewall of the polysilicon conductor. In another embodiment, the contact structure includes a polysilicon conductor having a tapered sidewall.

14 Claims, 4 Drawing Sheets

SUBGROUNDRULE SPACE FOR IMPROVED METAL HIGH-K DEVICE

FIELD OF THE INVENTION

The present invention relates to semiconducting structures and devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, in which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling through the thin gate dielectric. In addition, there are conventional limitations on the ability to form thin dielectric films with uniform thickness. Furthermore, thin $SiO_2$ gate dielectric layers provide a poor diffusion barrier to dopants and may allow high boron dopant penetration from the underlying channel region of the silicon during fabrication of the source and drain regions.

Recent MOS and CMOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent or better field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Typically, CMOS device manufacturing with conventional photolithography requires two masks to process both the n-channel and p-channel (NMOS and PMOS) transistors.

SUMMARY OF THE INVENTION

The present invention provides a method of fabricating a semiconducting device having a high-k gate dielectric atop a substrate. The present invention provides a method that may produce adjacent semiconducting regions positioned at a minimum pitch, wherein gate structures to each of the semiconducting regions include a gate dielectric layer that covers the entire semiconducting region, while minimizing the extension of the gate dielectric layer beyond the edge of the semiconducting region. By providing a gate dielectric layer that extends from a first edge of the semiconducting region to an opposing edge of the same semiconducting region, while minimizing the extension of the gate dielectric beyond the edge of the semiconducting region, the width effect may be substantially reduced. The method of manufacturing a semiconducting device includes:

providing a substrate including a plurality of semiconducting regions, wherein adjacent semiconducting regions of the plurality of semiconducting regions of the substrate are separated by an isolation region;

forming a gate dielectric layer overlying the substrate;

forming a metal layer overlying the gate dielectric layer;

forming at least two conductors atop the metal layer, wherein each conductor of the at least two conductors is positioned overlying one semiconducting region of the plurality of semiconducting regions;

forming a spacer abutting a sidewall of the each conductor of the at least two conductors, the spacer having a width that covers a portion of the metal layer overlying the semiconducting regions, wherein an exposed portion of the metal layer is overlying a portion of the isolation region; and etching the exposed portion of the metal layer and a portion of the gate dielectric layer underlying the exposed portion of the metal layer.

The metal layer positioned between the gate dielectric layer and the at least two conductors is composed of Ni, Co, Ti, Pt, W, Ir, Re, Ta, Hf, Mo, Nb, Al, or combinations thereof. The gate dielectric layer may include a high-k dielectric. The conductors may be composed of polysilicon.

The step of etching the exposed portion of the metal layer and the underlying gate dielectric layer can include an anisotropic etch. The spacer protects the underlying portion of the metal layer during removal of the exposed portion of the metal layer and the portion of the gate dielectric layer underlying the exposed portion of the metal layer. The anisotropic etch process may be provided by a reactive ion etch (RIE).

The adjacent semiconducting regions of the substrate may be separated by a minimum pitch. The minimum pitch may range from about 50 nm to about 60 nm. The exposed portion of the gate dielectric layer that is not protected by the spacers may have a sublithographic dimension. The sublithographic dimension may range from about 5 nm to about 50 nm.

In another aspect of the present invention, a method of fabricating a semiconducting device is provided, in which a conductor having a tapered sidewall is utilized to protect a portion of a gate stack composed of a metal layer and a gate dielectric layer to ensure complete coverage of underlying semiconducting regions that are positioned at minimum pitch, wherein exposed portions of the gate stack are removed. Broadly, the method includes the steps of:

providing a substrate including a plurality of semiconducting regions, wherein adjacent semiconducting regions of the plurality of semiconducting regions of the substrate are separated by an isolation region;

forming a gate dielectric layer overlying the plurality of semiconducting regions and the isolation region of the substrate;

forming a metal layer overlying the gate dielectric layer;

forming a conductor positioned overlying each of the plurality of semiconducting regions and positioned on a portion of the metal layer, said conductor including a base having a dimension equal to or greater than an underlying semiconducting region of the plurality of semiconducting regions and an upper surface having a dimension less than the base of the conductor; and etching an exposed portion of the metal layer and a portion of the gate dielectric layer underlying the exposed portion of the metal layer.

The metal layer may be composed of Ni, Co, Ti, Pt, W, Ir, Re, Ta, Hf, Mo, Nb, Al, or combinations thereof. The gate dielectric layer may be composed of a high-k dielectric.

The step of forming of the conductor may include depositing a layer of polysilicon atop the metal layer, and applying a taper etch to the layer of polysilicon. The taper etch may be provided by photolithography and etch processes. The taper etch may be provided using reactive ion etch (RIE) with a polymerizing gas mixture of $CF_4$ and oxygen. The etch chemistry of the taper etch may be selected so that the higher the $CF_4$ ratio, the less vertical and more tapered the etch. The taper etch may also include masking the structure with a patterned oxide layer and utilizing a mixture of $Cl_2$, HBr and oxygen as reactants in the reactive ion etch (RIE) process. The higher the oxygen concentration, the more tapered and less vertical the etch.

In another aspect, the present invention provides a semiconducting device. Broadly, the semiconducting device includes:

a substrate including at least one semiconducting region and an isolation region;

a gate structure atop the substrate having a gate dielectric layer positioned on the semiconducting region and a metal layer atop the gate dielectric layer, the gate structure having a width equal to or greater than the width of the at least one semiconducting region; and a contact structure including a base having a first width equal to the width of the gate structure and an upper surface having a second width, wherein the first width is greater than the second width.

The contact structure may include a conductor composed of polysilicon or amorphous Si and spacers, wherein each spacer abuts a sidewall of the conductor. The contact structure may include a conductor composed of polysilicon having a tapered sidewall. The gate structure may extend overlying a portion of the isolation regions.

The semiconducting device of the present invention may also include:

a substrate including at least one semiconducting region and an isolation region;

a gate structure atop the substrate having a gate dielectric layer positioned on the semiconducting region and a metal layer atop the gate dielectric layer, the gate structure having a width equal to or greater than the width of the at least one semiconducting region; and a contact structure including a base having a first width equal to the width of the gate structure and an upper surface having a second width, wherein the first width is greater than the second width, wherein at least an edge of the top surface that defines the second width overlies the semiconducting region.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
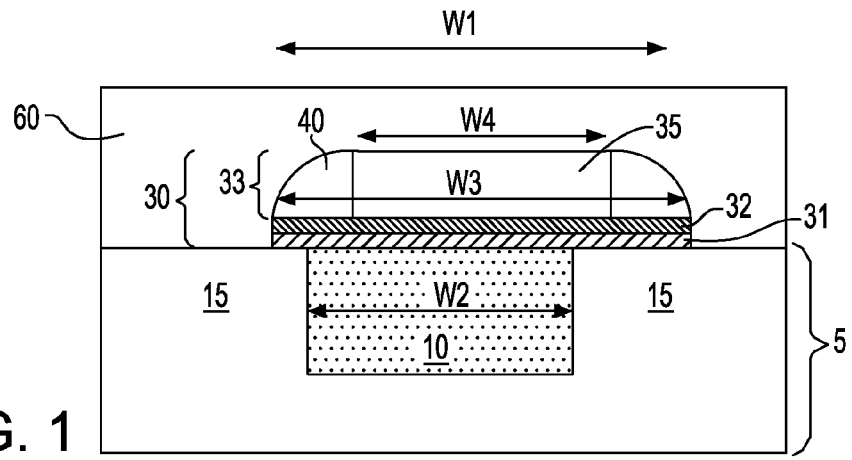
FIG. 1 is a side cross sectional view along the direction of travel of the gate depicting a gate structure to a semiconducting device, wherein the gate structure includes a contact structure having a conductor composed of polysilicon or amorphous Si and spacers, wherein each spacer abuts a sidewall of the conductor, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and structures relating to gate structures in semiconducting devices. When describing the inventive methods and structures, the following terms have the following meanings, unless otherwise indicated.

As used herein, "semiconductor region" (also referred to as an active device region) means an intrinsic semiconductor material that has been doped, that is, into which a dopant has been introduced, giving it different electrical properties than the intrinsic semiconductor material. Doping involves adding dopant atoms to an intrinsic semiconductor, which changes the electron and hole carrier concentrations of the intrinsic semiconductor. Dominant carrier concentrations in an extrinsic semiconductor classify it as either an N-type or P-type semiconductor.

As used herein, a "P-type semiconductor" refers to the addition of trivalent impurities to an intrinsic semiconductor that creates deficiencies of valence electrons, such as the addition of boron, aluminum, or gallium to a type IV semiconductor, such as Si.

As used herein, an "N-type semiconductor" refers to the addition of pentavalent impurities to an intrinsic semiconductor that contribute free elections, such as the addition of antimony, arsenic, or phosphorous to a type IV semiconductor, such as silicon.

A "gate structure" means a structure used to control output current (i.e., flow of carriers in the channel) of a semiconducting device, such as a field effect transistor (FET).

As used herein, the term "conductor" denotes a material having a room temperature conductivity of greater than $10^{-8}$ $(\Omega\text{-m})^{-1}$.

As used herein, a "metal" is an electrically conductive material, which in the metal atoms are held together by the force of a metallic bond, and the energy band structure of the metal's conduction and valence bands overlap, and hence, there is no energy gap.

As used herein, the term "polysilicon" denotes a material composed of multiple Si crystals.

As used herein, the term "selective" in reference to a material removal process denotes that the rate of material removal for a first material is greater than the rate of removal for at least another material of the structure to which the material removal process is being applied.

As used herein, the term "non-selective" in reference to a material removal process denotes that the rate of material removal for a first material is substantially the same as the other materials of the structure to which the material removal process is being applied.

As used herein, a "gate dielectric" is a layer of an insulator between the semiconductor device substrate and the gate conductor.

As used herein, "high-k" denotes a dielectric material featuring a dielectric constant (k) higher than about 3.9.

As used herein, the term "dopant regions" refers to portions of a semiconductor material in which the electrical conductivity of the material is dependent upon N-type or P-type dopants.

The term "anisotropic" denotes a material removal process in which the material removal rate in the direction normal to the surface of the material to be removed is greater than in the direction parallel to the surface of the material to be removed.

As used herein, the term "isolation region" denotes a structure that electrically insulates a first device region from a second device region.

The term "pitch" means the dimension separating a first semiconducting region from a second semiconducting region in a plurality of semiconducting regions.

The term "minimum pitch" denotes the minimum pitch dimension that can be lithographically obtained for a repeating unit.

The term "sublithographic" means less than the minimum dimension that can be defined lithographically.

As used herein, the term "width" as used to describe the width of the semiconducting regions and the width of the gate structure means a dimension that is substantially parallel to the surface of the substrate and substantially perpendicular to the length of the channel of the semiconducting device.

The phrase "taper" is defined herein to mean a structure that reduces in width from a base portion having a first width to an upper portion opposite the base portion having a reduced width.

The terms "overlying", "underlying", "atop", "under", or "positioned atop" means that a first element is present on a second element, wherein intervening elements, may be present between the first element and the second element.

The terms "direct physical contact", "positioned on" and "abutting" means that a first element and a second elements are connected without any intermediary conducting, insulating or semiconducting layers at the interface of the two materials.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

The present invention provides semiconductor devices and methods of forming semiconductor devices in which the width effect may be substantially reduced. The width effect results from oxygen increases in gate thickness that results from $SiO_2$ deposits. High-k dielectrics are highly permeable to oxygen diffusion. Typically, a high-k gate dielectric is positioned overlying a silicon substrate and a gate electrode is positioned overlying the high-k gate dielectric. Typically, processes such as lithography, annealing, and dielectric spacer formation can introduce oxygen, either as part of the process or unintentionally, as ambient oxygen, which can diffuse laterally (horizontally) into the high-k gate dielectric, wherein the diffused oxygen oxidizes portions of the underlying silicon substrate and possibly the overlying gate electrode, hence forming undesirable $SiO_2$ deposits. In instances when the source of the oxygen is from the end of the gate where it overlies an isolation region, the detrimental oxygen diffusion is often referred to as a width effect.

Figure 2:
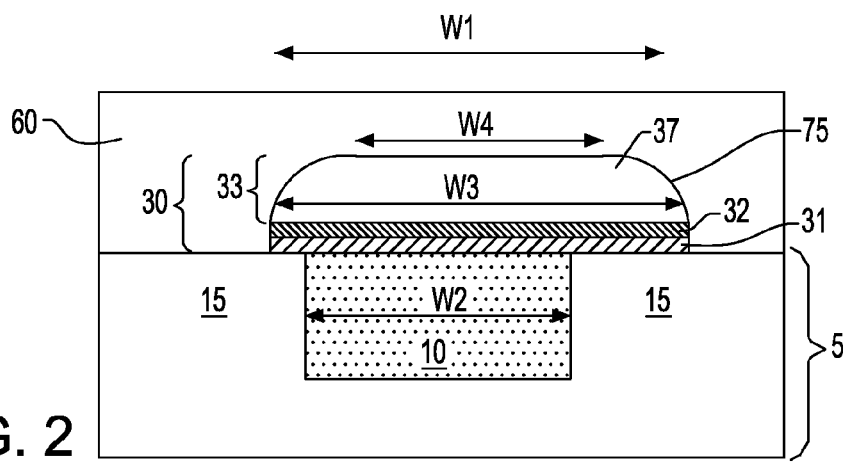
FIG. 2 is a side cross sectional view along the direction of travel of the gate depicting a gate structure to a semiconducting device, wherein the gate structure includes a contact structure having a conductor composed of polysilicon with a tapered sidewall, in accordance with the present invention.
Figure 3:
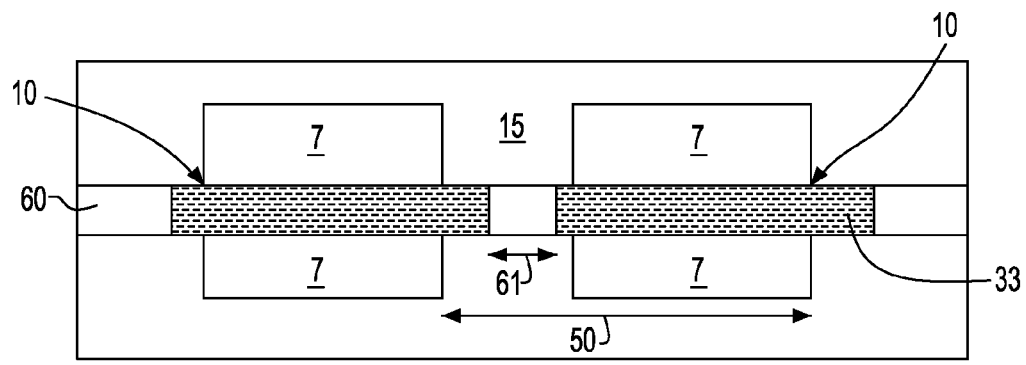
FIG. 3 is a top view at the level of the substrate depicting a gate structure to a semiconducting device, in accordance with the present invention.

The above described $SiO_2$ deposits can be undesirable because they effectively increase the thickness of the gate dielectric or decrease the thickness of the gate electrode. Furthermore, the $SiO_2$ deposits may reduce the net dielectric constant of the gate dielectric, which in turn can reduce the drive current of the transistor. Consequently, the benefit of utilizing a high-k gate dielectric is lost. Further, the $SiO_2$ deposits are undesirable because they attack the area of the silicon substrate where the channel is present or will be subsequently formed, thus detrimentally affecting the performance of the transistor that will be formed from the gate structure. FIGS. 1 to 3 depict embodiments of the inventive semiconducting device, which reduces the incidence of the width effect. The semiconducting device may include a substrate 5 including at least one semiconducting region 10 and isolation regions 15, a gate structure 30 atop the substrate 5 having a gate dielectric layer 31 positioned on the semiconducting region 10 and a metal layer 32 atop the gate dielectric layer 31, the gate structure 30 having a width $W_1$ equal to or greater than the width $W_2$ of the at least one semiconducting region 10, and a contact structure 33 including a base having a first width $W_3$ equal to the width of the gate structure $W_1$ and an upper surface having a second width $W_4$, wherein the first width $W_3$ is greater than the second width $W_4$.

Referring to FIG. 1, the contact structure 33 may include a conductor 35 and spacers 40, wherein each spacer 40 abuts a sidewall of the gate conductor 35. Referring to FIG. 2, the contact structure 33 may include a tapered conductor 37 composed of polysilicon having a tapered sidewall. The gate structure 30 extends overlying a portion of the isolation regions 15. The tapered conductor 37 may have an exterior sidewall 75 characterized by having a curvature. The tapered conductor 37 may have a sidewall having a substantially planar surface. Although FIG. 1 and FIG. 2 each depict a single semiconducting device, the present invention is applicable to a device containing a plurality of semiconducting devices. For example, the present invention may include a substrate having a plurality of semiconducting regions, i.e., active device regions, wherein adjacent semiconducting regions positioned at minimum pitch and are separated by an isolation region, wherein at least one gate structure, similar to the gate structures 33 depicted in FIGS. 1 and 2, is positioned corresponding to each of the plurality of semiconducting regions.

Referring to FIG. 3, the adjacent semiconducting regions 10 of substrate may be separated by a minimum pitch 50. The minimum pitch is measured from an edge of one semiconducting region 10 to the same edge of an adjacent semiconducting region 10. In one embodiment, the device width is 100 nm and the minimum pitch 50 ranges from about 160 nm to about 190 nm. In another embodiment, the device width is 100 nm and the minimum pitch 50 ranges from about 140 nm to about 160 nm. In an even further embodiment, the device width is about 60 nm minimum pitch 50 ranges from about 100 nm to about 120 nm.

The line gate contact 60 may be positioned connecting the gate structures 33 of the adjacent semiconducting regions. The portion 61 of the line gate contact 60 between adjacent semiconducting regions 10 that does not overly a portion of the gate dielectric layer 31 may have a sublithographic dimension 61. In one embodiment, the sublithographic dimension 61 ranges from about 4 nm to about 70 nm. In another embodiment, the sublithographic dimension 61 ranges from about 4 nm to about 50 nm. In an even further embodiment, the sublithographic dimension 61 ranges from about 4 nm to about 40 nm.

Figure 4A:
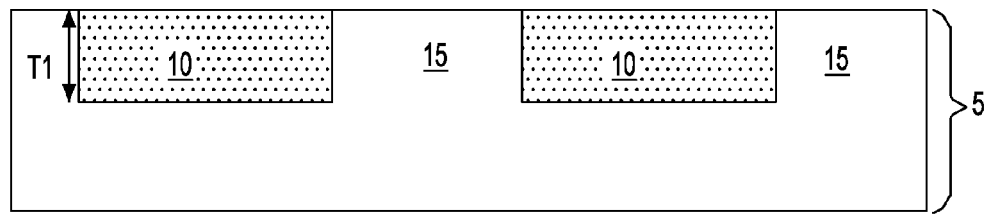
FIGS. 4A-4C and 4E are side cross sectional views depicting one embodiment of a method for forming a gate structure having a contact structure including a conductor composed of polysilicon or amorphous Si and spacers, wherein each spacer abuts a sidewall of the conductor, in accordance with the present invention.

FIGS. 4A-4D depict one embodiment of a method for forming a semiconducting device, in accordance with the present invention. Although, FIGS. 4A-4D depict two semiconducting regions 10 each including a gate structure 33, the present invention is equally applicable to device including any number of semiconducting regions 10, wherein each semiconducting region 10 may include one or more gate structures 30. FIG. 4A depicts an initial structure that may be used in the present method, in which the initial structure may include a substrate 5 including at least one semiconducting region 10 and at least one isolation region 15.

The substrate 5 may include, but is not limited to: Si-containing materials, GaAs, InAs and other like semiconductors. Si-containing materials as used to provide the substrate 5 include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, and annealed poly Si. In one embodiment in which the substrate 5 is a silicon-on-insulator (SOI) or SiGe-on-insulator (SGOI) substrate, the thickness of the Si-containing layer atop the buried insulating layer can have a thickness on the order of 10 nm or greater. The SOI or SGOI substrate may be fabricated using a thermal bonding process, or may be fabricated by an ion implantation process. The substrate 5 may be N-type or P-type depending on the type of device to be fabricated. The substrate 5 may optional include various active regions.

The isolation regions 15 may be formed in the substrate 5 using photolithography, etching and deposition processes. The isolation regions 15 may include an oxygen containing composition, such as an oxide, e.g., silicon oxide. The isolation regions 15 may be shallow trench isolation regions (STI). The isolation regions 15 may be formed by etching a trench in the substrate 5 utilizing a dry etching process, such as reactive-ion etching (RIE). Reactive ion etching is a form of plasma etching in which the surface to be etched is placed on an RF powered electrode and takes on a potential that accelerates the etching species that is extracted from a plasma towards the surface to be etched, in which a chemical etching reaction is taking place in the direction normal to the surface.

The film stack (not shown) may be employed to provide an etch mask to produce the trenches for forming the isolation regions 15, wherein the number of layers in the film stack and their composition are selected to provide etch selectivity. The film stack may be patterned so as to form a hard mask having a geometry that provides the trench within the substrate in a subsequent etch step. More specifically, a photoresist, not shown in the drawings, is formed on the exposed surface layer of nitride layer utilizing a conventional deposition process. The photoresist layer is then patterned utilizing lithography so as to expose selective regions of the film stack in which trenches are to be formed. The lithography step employed in the present invention includes exposing the photoresist to radiation to form a pattern in the photoresist and developing the pattern. The trench is then formed by etching the various layers of the film stack utilizing a conventional dry etching process such as RIE, ion-beam etching, plasma etching or any other like dry etch process. A combination of the aforementioned dry etch processes may also be used in providing the trench. Following trench etching, the patterned photoresist is removed by a stripping process, such as oxygen ashing.

The photoresist layer utilized to provide the trench that provides the isolation regions is patterned using the minimum pitch that may be achieved with the lithography apparatus. In some instances, if the mask pitch were to be below the minimum pitch, then adjoining resist shapes would begin to short, coalesce, bridge or join together. The photoresist layer is patterned using a single mask at minimum pitch to provide the semiconducting device regions 10 for both the N-type and P-type devices of a complementary metal oxide semiconductor (CMOS) device.

Specifically, the photoresist layer may be patterned to position isolation regions 15 so that adjacent semiconducting regions 10 are separated at approximately the minimum pitch. In one embodiment, the minimum pitch 50 ranges from about 160 nm to about 190 nm. In another embodiment, the minimum pitch 50 ranges from about 140 nm to about 160 nm. In an even further embodiment, the minimum pitch 50 ranges from about 100 nm to about 120 nm.

In a following process step, a trench dielectric material is formed in the trench utilizing a deposition processes including, but not limited to: CVD, plasma-assisted CVD, sputtering and other like deposition processes. Suitable trench dielectric materials that can be employed in the present invention include, but are not limited to: tetraethylorthosilicate (TEOS), $SiO_2$, flowable oxides and other like dielectric materials. When TEOS is employed, an optional densification step may be employed prior to planarization. It is noted that the deposition process employed in the filling the trench may also form a layer of the trench dielectric material on top of the substrate.

Following dielectric fill, the structure may be planarized down to the surface of the semiconducting region 10 of the substrate 15 utilizing a planarization process, such as chemical-mechanical polishing (CMP) or grinding. Planarization is a material removal process that employs at least mechanical forces, such as frictional media, to produce a planar surface. Chemical Mechanical Planarization is a material removal process using both chemical reactions and mechanical forces to remove material and planarize a surface. The trenches may be optionally lined with a liner material, e.g., an oxide, and then chemical vapor (CVD) or another like deposition process is used to fill the trench with a dielectric material, such as oxide, e.g., silicon oxide. The optional liner material may be formed by oxidizing the trench under conditions that are capable of thermally growing a conformal oxide layer on the sidewalls of the trench.

Still referring to FIG. 4A, the semiconducting region 10 may include a Si-containing material. The Si-containing material may be composed of the substrate material. The Si-containing material may be composed of Si, bulk Si, single crystal Si, polycrystalline Si, SiGe, amorphous Si, silicon-on-insulator substrates (SOI), SiGe-on-insulator (SGOI), strained-silicon-on-insulator, and annealed poly Si. The Si-containing material may have a thickness $T_1$ ranging from about 3 nm to about 120 nm. The Si-containing material may have a thickness $T_1$ ranging from about 12 nm to about 100 nm.

Figure 4B:
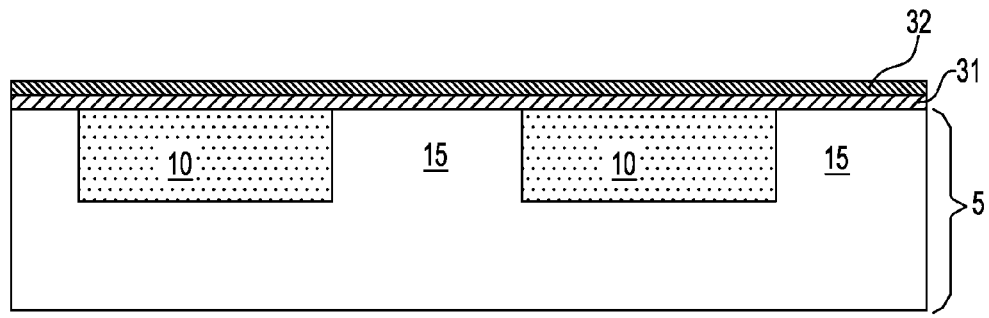

FIG. 4B depicts the structure depicted in FIG. 4A following a process sequence that includes forming a gate dielectric layer 31 overlying the substrate 5 and a metal layer 32 positioned overlying the gate dielectric layer 31. The gate dielectric layer 31 may be composed of an oxide material. Suitable examples of oxides that can be employed as the gate dielectric layer 31 include, but are not limited to: $SiO_2$, $Al_2O_3$, $ZrO_2$, $HfO_2$, $Ta_2O_3$, $TiO_2$, perovskite-type oxides and combinations and multi-layers thereof The gate dielectric layer 31 may also be composed of a nitride, oxynitride, or a combination (or multi layer) of oxide, nitride and oxynitride. In one embodiment, the gate dielectric layer 31 has a thickness greater than approximately 0.8 nm. In another embodiment, the gate dielectric layer 31 has a thickness ranging from about 1.0 nm to about 6.0 nm. The gate dielectric layer 31 may be formed using chemical vapor deposition (CVD). Chemical vapor deposition (CVD) is a deposition process in which a deposited species is formed as a result of chemical reactions between gaseous reactants at greater than room temperature (25° C. to 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (PECVD), Metal-Organic CVD (MOCVD), Atomic Layer Deposition (ALD) and others. The gate dielectric layer 31 can include a layer that is formed by an aqueous treatment or a thermal growing process, which may include oxidation, oxynitridation, nitridation, and/or plasma or radical treatment. Other deposition methods can include by physical processes such as evaporation or sputtering.

The gate dielectric layer 31 may be a high-k gate dielectric comprised of an insulating material having a dielectric constant of greater than about 3.9. In another embodiment, the gate dielectric layer 31 is a high-k gate dielectric comprised of an insulating material having a dielectric constant greater than 7.0. The high-k gate dielectric layer may be provided by $HfO_2$, hafnium silicate, hafnium silicon oxynitride or a combination thereof.

The metal layer 32 may be formed atop the gate dielectric layer 31. The metal layer 32 may be composed of Ni, Co, Ti, Pt or combinations and alloys thereof as well as multilayers thereof. The metal layer 32 can be deposited by physical vapor deposition (PVD), which may include but is not limited to: plating, sputter deposition, molecular beam epitaxial deposition, electron beam deposition and combinations thereof. The metal layer 32 can be deposited by chemical vapor deposition (CVD), which may include, but is not limited to: Atmospheric Pressure CVD (APCVD), Low Pressure CVD (LPCVD), Plasma Enhanced CVD (EPCVD), Metal-Organic CVD (MOCVD) and combinations thereof. The metal layer 32 may be deposited using a conformal deposition method. A conformal layer is a deposited material having a thickness that remains substantially the same regardless of the geometry of underlying features on which the layer is deposited.

The metal layer 32 may be a metal nitride layer. The metal nitride layer may be composed of TiN, TaN, WN, Ni, Co, Ti, Pt, W, Ir, Re, Tu, Ta, Hf, Mo, Nb, Al, or combinations thereof or combinations and alloys thereof. The metal nitride layer may have a thickness ranging from about 1 nm to about 5 nm. In another embodiment, the metal nitride layer may have a thickness ranging from about 2 nm to about 12 nm. The metal nitride layer may be deposited by physical vapor deposition (PVD), which may include but is not limited to: plating, sputter deposition, molecular beam epitaxial deposition, electron beam deposition and combinations thereof. The metal nitride layer may be deposited by chemical vapor deposition (CVD), which may include, but is not limited to: Atmospheric Pressure CVD (APCVD), Low Pressure CVD (LPCVD), Plasma Enhanced CVD (EPCVD), Metal-Organic CVD (MOCVD) and combinations thereof. The metal nitride layer may be deposited using a conformal deposition method.

The deposition method for forming the metal nitride layer 32 may include atomic layer deposition (ALD) or pulse CVD. When the metal nitride layer is deposited by pulsed CVD (ALD), nitrogen and metal precursors are pulsed one after each other with optional neutral gas added in between the pulsing steps.

The metal layer 32 may be a workfunction defining metal. By "workfunction defining metal" it is meant a metal layer that can be used to adjust or set the workfunction of the gate stack. For N-type workfunctions, the workfunction defining metal comprises at least one element from Groups IIIB, IVB or VB of the Periodic Table of Elements (the nomenclature of the elements is based on the CAS version). Elements within the Lanthanide Series (e.g., La, Ce, Pr, Nd, Pm, Sm, Eu, Gd, Tb, Dy, Ho, Er, Tm, Yb or Lu) also contemplated herein. Illustrative examples of metals that can be used in providing an N-type workfunction to a conductive electrode comprise, but are not limited to: Sc, Y, La, Zr, Hf, V, Nb, Ta, Ti and elements from the Lanthanide Series. The workfunction defining metal used in providing the N-type workfunction may be one of the elements from the Lanthanide group. For P-type workfunctions, the workfunction defining metal comprises at least one element from Groups VIB, VIIB and VIII of the Periodic Table of Elements (the nomenclature of the elements is based on the CAS version). Illustrative examples of metals that can be used in providing a P-type workfunction to a conductive electrode comprise, but are not limited to: Re, Fe, Ru, Co, Rh, Ir, Ni, Pd, and Pt. The workfunction defining metal used in providing the p-type workfunction shift is one of Re, Ru or Pt. Although the metal layer 32, is depicted in each of the supplied figures, embodiments of the present invention have been contemplated in which the metal layer is omitted.

Figure 4C:
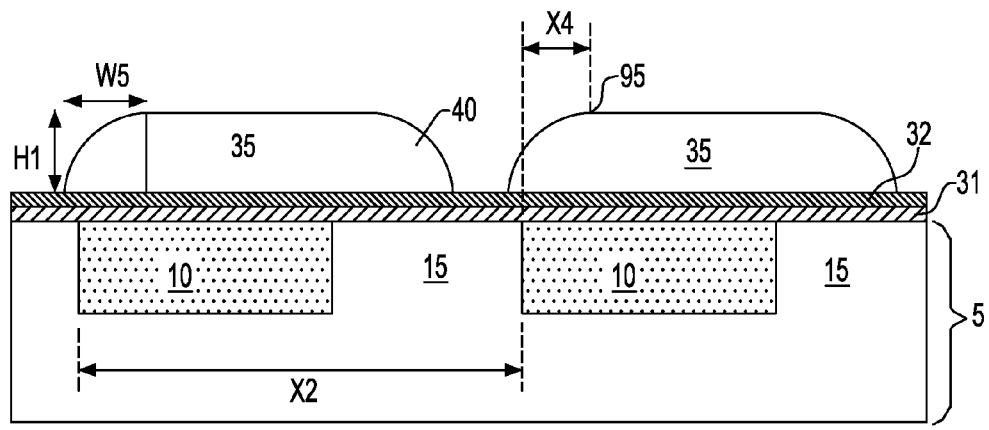

FIG. 4C depicts forming at least two contact structures 33 overlying the metal layer 32 and the gate dielectric layer 31, wherein each contract structure 33 is positioned overlying at least a portion of the semiconducting region 10. Each of the contact structures 33 includes a conductor 35 and spacers 40, wherein each spacer 40 abuts a sidewall of the conductor 35. The spacers 40 may have a width that ensures complete coverage of the underlying semiconducting regions 10 with the gate dielectric layer 31 and the metal layer 32. The spacers 40 may have a width that ensures complete coverage of semi-conducting regions 10 that are positioned at minimum pitch.

Still referring to FIG. 4C, the conductor 35 may be formed atop the semiconducting region 10 of the substrate 5 utilizing deposition and lithography processes. Specifically, the conductor 35 may be provided atop the substrate 5 by depositing a layer of the conductor material and patterning the layer of the conductor material using photolithography and etch processes.

The layer of conductor material may be composed of a silicon containing material, which may be polysilicon. The layer of conductor material may be composed of polycrystalline Si, SiGe, SiGeC or combinations thereof. The layer of conductor material may be formed utilizing a deposition process, such as CVD and/or physical vapor deposition (PVD). The layer of conductor material may be composed of a doped silicon containing material. The dopant can be elements from the group III-A or group V of the Periodic Table of Elements. The dopant may be introduced during deposition of the layer of conductor material or following subsequent patterning and etching of the layer of conductor material to provide the conductor 35.

Following the deposition of the layer of conductor material, an etch mask is formed atop the layer of conductor material protecting the portion of the layer of the conductor material that provides the conductor 35, wherein the portions exposed by the etch mask are removed by an etch process. The etch mask may be provided by a patterned photoresist layer. The patterned photoresist layer is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected, while the exposed regions are removed using a selective etching process that removes the unprotected regions. The resist is an etch mask for a hard mask overlying the conductor. The conductor 35 may also be a disposable insulator. The layer of conductor material may be etched using a selective etch chemistry that removes the exposed portion of the layer of conductor material selective to the patterned photoresist and the underlying metal layer 32. The selective etch process may be an anisotropic etch. The anisotropic etch process may be provided by reactive ion etching (RIE). Reactive ion etching is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface. Therefore, the anisotropic etch of a conductor material such as silicon is usually tailored to yield a sidewall angle of about 90 degrees relative to the substrate surface.

Figure 4D:
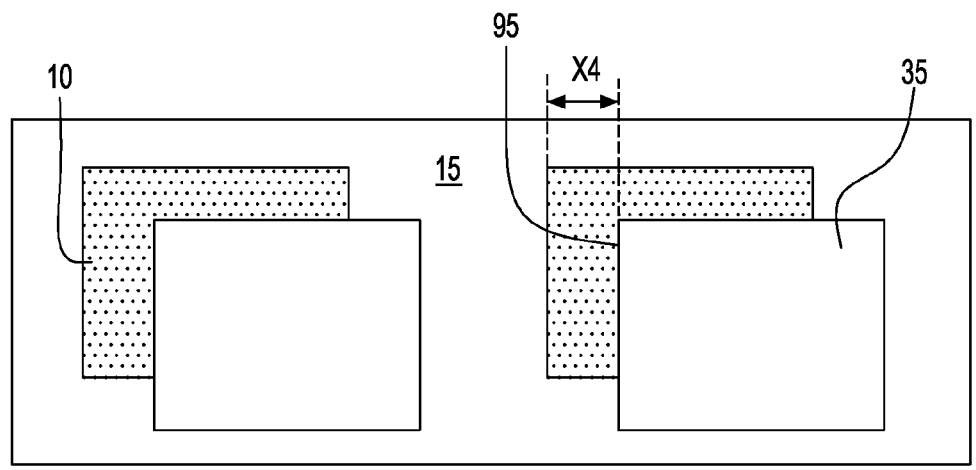
FIG. 4D is a top planar view of the structure depicted in FIG. 4C but with spacers, high K dielectric and metal layer omitted in order to illustrate the relative alignment of transistor features.

FIG. 4D depicts a top down view of the structure at this point in the process, in which the metal layer 32 and the gate dielectric 31 have been omitted from the figure to provide a clearer representation of the underlying silicon layer 10. FIG. 4D depicts one embodiment of the structure at minimum pitch. In the embodiment shown, the conductor 35 was defined by the same minimum pitch mask used to define silicon layer 10. Therefore, the pitch X1 of block of the layer of the conductor 35 equals the pitch X2 of the block of the silicon layer 10. It is noted that from the top down view, the size and shape of the blocks of the layer of the conductor 35 are the same as the size and shape of the blocks of silicon layer 10. If the blocks of conductor 35 were to be made a larger size, then the adjacent blocks would be in danger of shorting together in the region that is overlying the isolation region 15. In one embodiment, it is a requirement that the metal layer 32 and gate dielectric 31 fully cover the silicon layer 10 in the entire region that is to become the gate. In some instances there is a lithographic alignment error or overlay error, wherein there is misalignment of the blocks of conductor 35 and the blocks of the underlying silicon layer 10. The misalignment is depicted by the distance indicated by X4. One consequence of the lithographic misalignment may be that the block of the conductor 35 has at least a topmost edge that overlies the block of the silicon layer 10, as depicted in FIG. 4D. In the embodiment depicted in FIG. 4D, at least a bottom most edge also overlies the block of the silicon layer 10, because the block of the conductor layer 35 was formed by a reactive ion etch process (RIE) process that also formed a sidewall angle on the block of the conductor layer 35, which is about 90 degrees relative to the surface of the substrate.

FIG. 4D also demonstrates how a minimum pitch resist mask, with an edge overlying block of the silicon layer 10, can be used to produce an underlying patterned metal layer 32 and dielectric layer 31 that fully covers the underlying block of the silicon layer 10, and does not have an edge that overlies the block of the silicon layer 10. The topmost structure (because of lithographic misalignment) will by definition always have an edge that overlies the lower structure. Note that the invention is also applicable to any pair of vertically misaligned structures, in which the uppermost structure always has an edge overlying a lower structure, where it is desirable to fully cover the underlying structure with the upper layer or with layers masked by the upper layer. The pair of vertically misaligned minimum pitch structures is just one example of where there is always an upper edge, for example edge 95 of the block of the conductive layer 35, overlying the lower structure to be covered.

Following etching of the layer of conductor material to provide the gate conductor contact 35, spacers 40 are formed abutting the sidewalls of the gate conductor contact 35. The spacers 40 may be present on a sidewall of the gate conductor contact 35 and are positioned on at least a portion of the face of the gate structure 33 that is perpendicular to a sidewall of the gate structure 33 that is overlying and adjacent to the portion of the substrate 5 in which the source and drain dopant regions 7 are subsequently formed, as depicted in FIG. 3. The spacers 40 are composed of a dielectric material such as an oxide, nitride, oxynitride and/or any combination thereof. The spacers 40 may be composed of silicon nitride ($Si_3N_4$). The spacers 40 may also be composed of polysilicon.

The spacers 40 may be formed by deposition and etching. The width W5 of the spacers 40 may be provided to ensure coverage of the semiconducting regions 10 with the gate dielectric 31, wherein the spacers 40 serve as an etch mask that protects the portion of the metal layer 32 and underlying gate dielectric 31 that covers the semiconducting regions 10, while the exposed portion of the metal layer 32 and underlying gate dielectric 31 that is positioned over the isolation regions 15 is removed. If edge 95 of layer 35 is displaced by X4 from the closest edge of semiconduction region 10, then a width W5 of spacer 40 which is greater or equal to X4 is needed to ensure coverage of semiconducting region 10.

In one embodiment, the spacers 40 have a width $W_5$ ranging from about 5 nm to about 25 nm. In another embodiment, the spacers 40 a width $W_5$ ranging from about 7 nm to about 15 nm. The spacer width should be equal to or greater than the overlay error of the lithography tool for the embodiment shown, or for any where the resist edge of the upper structure and lower structure coincide and where overlay error is responsible for misalignment.

Figure 4E:
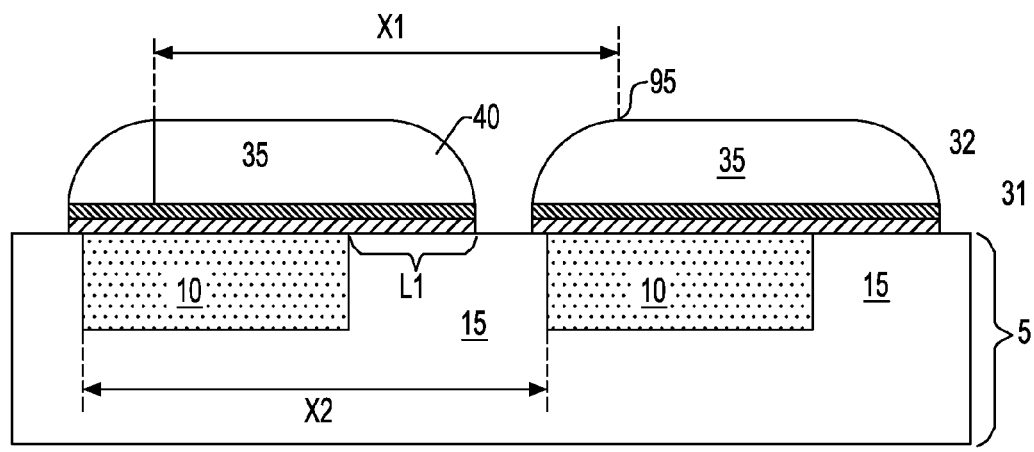

Referring to FIG. 4E, after formation of the spacers 40, an etch process removes the portion of the metal layer 32 and an underlying portion of gate dielectric 31 that are exposed, while the portion of the metal layer 32 and the layer of the gate dielectric layer 31 underlying the spacers 40 are protected. The etch process may include an anisotropic etch including a selective etch chemistry. The etch process may be provided by reactive ion etch. The etch process may include a two step etch process, in which the first step comprises an etch chemistry that removes the exposed portion of the metal layer 32 selective to the spacers 40, the conductor and the gate dielectric 31. In a second etch step, the etch chemistry removes the exposed portion of the gate dielectric 31 selective to the spacers 40, the gate conductor contact 33 and the underlying isolation region 15. The etch process may include a single step etch that removes the exposed portion of the metal layer 32 and the underlying gate dielectric layer 31 selective to the to the spacers 40, the gate conductor contact 33 and the underlying isolation region 15.

A portion of the gate dielectric layer 31 may extend from the semiconducting regions 10 atop a portion of the isolation regions 15. In one embodiment, the length L1 of the portion of the gate dielectric layer 31 that extends from the semiconducting regions 10 atop a portion of the isolation regions 15 is approximately equal to two times the overlay alignment error of the lithography tool used to define the pattern.

The structure 30 at this point in the process fully covers region 10 so that all edges of structure 30 overlie the dielectric fill of region 15. The shape of structure 30 is of similar shape region 10, but is of larger dimension so that all edges of region 10 are fully covered by structure 30. In a following process step, the an HF clean is applied, followed by an option blanket polysilicon deposition 60.

A blanket layer of polysilicon may be formed atop the structure depicted in FIGS. 4C, 4D utilizing a deposition process such as, for example, physical vapor deposition or chemical vapor deposition. Thereafter, the blanket layer of polysilicon may be patterned and the conductor 35, metal layer 32 and gate dielectric layer 31 can be further patterned and etched to provide a line gate contact 60 positioned connecting the remaining gate structures 33 of the adjacent semiconducting regions 10, as depicted in FIG. 3.

After etching the metal layer 32 and the gate dielectric layer 31, the structure may be processed using conventional semiconductor manufacturing steps. For example, extension and source and drain dopant regions 7 are formed into the substrate 5, as depicted in FIG. 3. The extension and source and drain dopant regions 7 are formed utilizing ion implantation and an annealing step. PFET devices are produced within Si-containing substrates by doping the source and drain region of the substrate with group III-A elements. NFET devices are produced within Si-containing substrates by doping the substrate with group V elements. The annealing step serves to activate the dopants that were implanted by the previous implant step. After this point in the process sequence semiconducting regions 10 include a portion underlying the gate contact 60 and gate structure 33 which does not receive the extension and source and drain dopants and a portion not receiving the extension and source and drain dopant regions 7 which is positioned to the side of the gate contact 60 and gate structure 33.

Figure 5A:
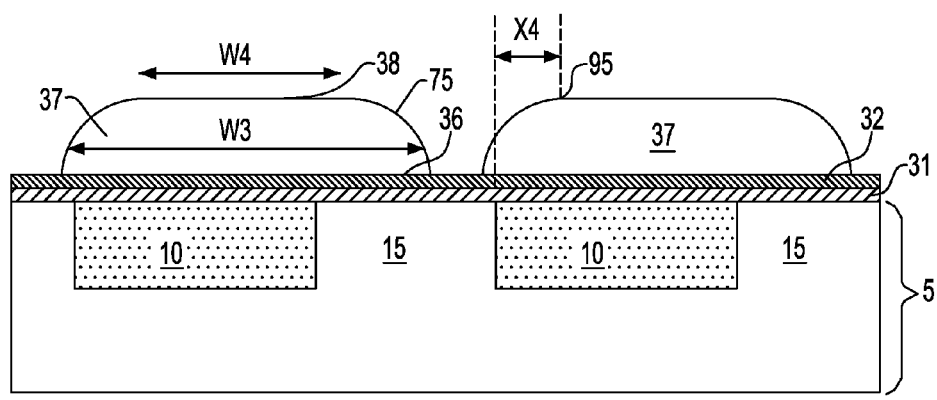
FIGS. 5A and 5B are side cross sectional views depicting another embodiment of a method for forming a gate structure, wherein the gate structure includes a contact structure having a conductor composed of polysilicon with a tapered sidewall, in accordance with the present invention.
Figure 5B:
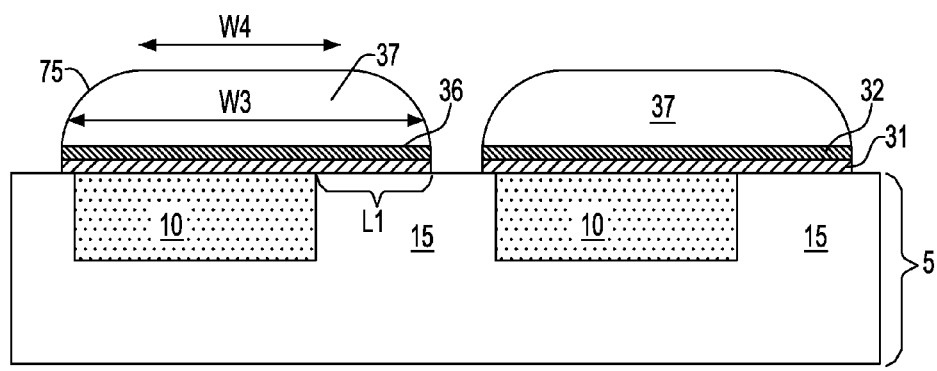

FIGS. 5A-5B, depict another embodiment of a method of fabricating a semiconducting device, in which a conductor 37 having a tapered sidewall 75 is utilized to protect a portion of a gate stack composed of a metal layer 32 and a gate dielectric layer 31 to ensure complete coverage of an underlying semiconducting region 10. The method may include providing a substrate 5 including a plurality of semiconducting regions 10, wherein adjacent semiconducting regions 10 of the substrate 5 are separated by an isolation region 15; forming a gate dielectric layer 31 overlying the plurality of semiconducting regions 10 and the isolation region 15 of the substrate 5; forming a metal layer 32 overlying the gate dielectric layer 31; forming a conductor 37 positioned overlying each of the semiconducting regions 10, the conductor 37 positioned on a portion of the metal layer 32, the conductor 37 including a base 36 having a dimension $W_3$ equal to or greater than an underlying semiconducting region 10 and an upper surface 38 having a dimension $W_4$ less than the base 36 of the conductor 37; and etching an exposed portion of the metal layer 32 and a portion of the gate dielectric layer 31 underlying the exposed portion of the metal layer 32.

Applicants note that the initial structure, as depicted and described above with reference to FIG. 4A, as well as the metal layer 32 and gate dielectric layer 31, as depicted and described above with reference to FIG. 4B, are equally applicable to the embodiments of the present invention that are depicted in FIGS. 5A and 5B.

Referring to FIG. 5A, following the formation of the metal layer 32 and the gate dielectric layer 31, the step of forming the conductor 37 may include depositing a layer of conductor material atop the metal layer 32; and applying a taper etch to the layer of conductor material. The taper etch is provided using reactive ion etch (RIE) with a polymerizing gas mixture of $CF_4$ and oxygen. In one example, the higher the $CF_4$ ratio, the less vertical and more tapered the etch. The structure may be masked with a patterned oxide layer and a mixture of $Cl_2$, HBr and oxygen may be used as reactants in the reactive ion etch (RIE) process. In one example, the higher the oxygen concentration, the more tapered and less vertical the etch.

Still referring to FIG. 5A, following taper etch the sidewall 75 of the conductor 37 is characterized as being tapered. The tapered sidewall 75 provides a conductor 37 having a base 36 with a width $W_3$ that is equal to or greater than the width of the underlying semiconducting region 10, and an upper surface 38 having a width $W_4$ that is less than the width $W_3$ of the base 36 of the conductor 37. In one embodiment, the width $W_3$ of the base 36 of the conductor 37 that is 10 nm more than the width W4 of the upper surface 38. In another embodiment, the width $W_3$ of the base 36 of the conductor 37 that is 20 nm more than W4. In an even further embodiment, the width $W_3$ of the base of the conductor 37 that is 30 nm more than W4.

Referring to FIG. 5B, after formation of the conductor 37, an etch process removes the portion of the metal layer 32 and the gate dielectric layer 31 that are exposed, while the portion of the metal layer 32 and the gate dielectric layer 31 underlying the conductor 37 are protected. The etch process may include an anisotropic etch including a selective etch chemistry. The etch process may be provided by reactive ion etching. The etch process may include a two step etch process, in which the first step comprises an etch chemistry that removes the exposed portion of the metal layer 32 selective to the conductor 37 and the gate dielectric layer 31. In a second etch step, the etch chemistry removes the exposed portion of the gate dielectric layer 31 selective to the conductor 37 and the underlying isolation region 15. The etch process may include a single step etch that removes the exposed portion of the metal layer 32 and the underlying gate dielectric layer 31 selective to the conductor 37 and the underlying isolation region 15. Following etch, the structure depicted in FIG. 5B may be processed in a similar manner as the embodiments of the present invention described above with reference to FIGS. 4A-4D.

The present invention may provide gate structures 30 to semiconducting regions that are positioned at minimum pitch, wherein each gate structure 30 is composed of a gate dielectric layer 31 and a metal layer 32 that covers the entire width of the semiconducting region 10 on which the gate structure 30 is positioned. Hence, the present invention may reduce the width effect.

While the present invention has been particularly shown and described with respect to the preferred embodiments thereof, it will be understood by those skilled in the art that the foregoing and other changes in forms of details may be made without departing from the spirit and scope of the present invention. It is therefore intended that the present invention not be limited to the exact forms and details described and illustrated, but fall within the scope of the appended claims.

What is claimed is:

1. A method of fabricating a semiconducting device comprising:
    providing a substrate including a plurality of semiconducting regions, wherein adjacent semiconducting regions of the plurality of semiconducting regions of the substrate are separated by an isolation region;
    forming a gate dielectric layer overlying the substrate;
    forming a metal layer overlying the gate dielectric layer;
    forming at least two conductors atop the metal layer, wherein each conductor of the at least two conductors is positioned overlying one semiconducting region of the plurality of semiconducting regions;
    forming a spacer abutting a sidewall of the each conductor of the at least two gate conductors, the spacer having a width that covers a portion of the metal layer that is overlying the semiconducting regions, wherein an exposed portion of the metal layer is overlying a portion of the isolation region; and
    etching the exposed portion of the metal layer and a portion of the gate dielectric layer underlying the exposed portion of the metal layer.

2. The method of claim 1, wherein the metal layer comprises a metal nitride.

3. The method of claim 1, wherein the gate dielectric layer comprises a high-k dielectric.

4. The method of claim 1, wherein the etching of the exposed portion of the metal layer comprises an anisotropic etch.

5. The method of claim 1, wherein the spacer comprises a dielectric.

6. The method of claim 1, wherein each conductor comprises polysilicon.

7. The method of claim 1, wherein the adjacent semiconducting regions of the substrate are separated by a minimum pitch.

8. The method of claim 7, wherein the minimum pitch ranges from about 50 nm to about 60 nm.

9. The method of claim 1, wherein the exposed portion of the metal layer has a sublithographic dimension.

10. The method of claim 9, wherein the sublithographic dimension ranges from about 5 nm to about 50 nm.

11. A method of fabricating a semiconducting device comprising:
    providing a substrate including a plurality of semiconducting regions, wherein adjacent semiconducting regions of the plurality of semiconducting regions of the substrate are separated by an isolation region;
    forming a gate dielectric layer overlying the plurality of semiconducting regions and the isolation region of the substrate;
    forming a metal layer overlying the gate dielectric layer;
    forming a conductor positioned overlying each of the plurality of semiconducting regions, the conductor positioned on a portion of the metal layer, the conductor comprising a base having a dimension equal to or greater than an underlying semiconducting region of the plurality of semiconducting regions and an upper surface having a dimension less than the base of the conductor; and
    etching an exposed portion of the metal layer and a portion of the gate dielectric layer underlying the exposed portion of the metal layer.

12. The method of claim 11, wherein the metal layer comprises a metal nitride.

13. The method of claim 11, wherein the gate dielectric layer comprises a high-k dielectric.

14. The method of claim 11, wherein the forming of the conductor comprises:
    depositing a layer of polysilicon atop the metal layer; and
    applying a taper etch to the layer of polysilicon.

* * * * *